(12) United States Patent
Kuwajima et al.

(10) Patent No.: US 10,290,577 B2
(45) Date of Patent: May 14, 2019

(54) SEMICONDUCTOR DEVICE

(71) Applicant: Renesas Electronics Corporation, Tokyo (JP)

(72) Inventors: Teruhiro Kuwajima, Ibaraki (JP); Akira Matsumoto, Ibaraki (JP); Yasutaka Nakashiba, Ibaraki (JP); Takashi Iwadare, Ibaraki (JP)

(73) Assignee: Renesas Electronics Corporation, Tokyo ( * ) Notice: Subject to any disclaimer, the term of this patent is extended or adjusted under 35 U.S.C. 154(b) by 0 days.

(21) Appl. No.: 16/009,429

(22) Filed: Jun. 15, 2018

(65) Prior Publication Data

US 2018/0294222 A1 Oct. 11, 2018

Related U.S. Application Data

(63) Continuation of application No. 15/186,734, filed on Jun. 20, 2016, now Pat. No. 10,026,689.

(30) Foreign Application Priority Data

Aug. 27, 2015 (JP) .................................. 2015-167789

(51) Int. Cl.
*H01L 23/495* (2006.01)
*H01L 23/522* (2006.01)

(52) U.S. Cl.
CPC ...... *H01L 23/5227* (2013.01); *H01L 23/4952* (2013.01); *H01L 23/49551* (2013.01); *H01L 2224/05554* (2013.01); *H01L 2224/4813* (2013.01); *H01L 2224/49175* (2013.01)

(58) Field of Classification Search
CPC ............. H01L 23/5227; H01L 23/4952; H01L 23/49551; H01L 2224/05554; H01L 2224/4813; H01L 2224/49175
See application file for complete search history.

(56) References Cited

U.S. PATENT DOCUMENTS

| | | | |
|---|---|---|---|
| 2004/0004525 A1* | 1/2004 | Rittner | H01F 17/0006 336/200 |
| 2009/0244866 A1* | 10/2009 | Kawano | H01L 29/0649 361/765 |
| 2009/0302420 A1 | 12/2009 | Nakashiba | |
| 2014/0264722 A1 | 9/2014 | Nakashiba et al. | |
| 2015/0369681 A1 | 12/2015 | Imai et al. | |

FOREIGN PATENT DOCUMENTS

JP 2011-082212 A 4/2011

* cited by examiner

*Primary Examiner* — Mark W Tornow
(74) *Attorney, Agent, or Firm* — Shapiro, Gabor and Rosenberger, PLLC

(57) ABSTRACT

A SOP has a semiconductor chip. The chip includes a pair of a lower layer coil and an upper layer coil laminated through an interlayer insulating film formed therebetween, a first circuit unit electrically coupled to the upper layer coil, and a plurality of electrode pads. Further, it has a wire for electrically coupling the upper layer coil and the first circuit unit, a plurality of inner leads and outer leads arranged around the semiconductor chip, a plurality of wires for electrically coupling the electrode pads of the semiconductor chip and the inner leads, and a resin made sealing member for covering the semiconductor chip. The wire extends along the extending direction of the wires.

16 Claims, 8 Drawing Sheets

SEMICONDUCTOR DEVICE

CROSS-REFERENCE TO RELATED APPLICATIONS

The disclosure of Japanese Patent Application No. 2015-167789 filed on Aug. 27, 2015 including the specification, drawings and abstract is incorporated herein by reference in its entirety.

BACKGROUND

The present invention relates to a semiconductor device having, for example, a semiconductor chip with two coils which are laminated through an interlayer insulating film formed therebetween.

Micro transformer elements, as well known, have a structure in which two coils are laminated through an interlayer insulating film formed therebetween over a substrate. The micro transformer element has a transmission side coil coupled to a transmission circuit and a reception side coil coupled to a reception circuit.

For example, Japanese Unexamined Patent Application Publication No. 2011-82212 describes the above micro transformer element, and discloses a structure in which a semiconductor chip and the other semiconductor chip are coupled through external wiring (wire). The semiconductor chip has a micro transformer chip and a transmission circuit. The other semiconductor chip has a reception circuit.

SUMMARY

In a pair of inductor elements (micro transformer elements) described in Japanese Unexamined Patent Application Publication No. 2011-82212, one semiconductor chip with a pair of inductor elements and the other semiconductor chip without the inductor element are wired.

In this case, it is difficult to assemble the semiconductor device, due to a difference in chip thicknesses of the two chips, a difference of film structures of interlayer insulating films, and a difference of pad structures. Further, if the wire for coupling the chips is long, a wire flow occurs at the time of resin molding. As a result of this, it is further difficult to assemble the semiconductor device.

Other objects and new features will be apparent from the following detailed description and the accompanying drawings.

According to one embodiment of the present invention, there is provided a semiconductor device having a semiconductor chip including, a lower layer coil and an upper layer coil both of which are laminated through an interlayer insulating film formed therebetween over a substrate, a circuit unit electrically coupled to the upper layer coil, and a plurality of electrode pads. Further, there are provided a first wire, a plurality of lead units, and a plurality of second wires. The first wire is to electrically couple the upper layer coil and the circuit unit, and arranged over the semiconductor chip. The lead units are arranged around the semiconductor chip. The second wires are to couple the electrode pads of the semiconductor chip and each of the lead units. The first wire extends along an extending direction of the second wires.

According to one embodiment, there is provided a semiconductor device including a lower layer coil and an upper layer coil both of which are laminated through an interlayer insulating film formed therebetween over a substrate, a circuit unit electrically coupled to the upper layer coil, and a plurality of electrode pads. Further, there are provided a first wire, a plurality of lead units, and a plurality of second wires. The first wire is to electrically couple the upper layer coil and the circuit unit, and arranged over the semiconductor chip. The lead units are arranged around four sides of a main surface of the semiconductor chip. The second wires are to electrically couple the electrode pads of the semiconductor chip respectively to the lead units. The first wire extends along an extending direction of the second wire coupled to the electrode pad formed in a position nearest to a center of the upper layer coil in plan view, of the electrodes pads provided along the four sides of the main surface of the semiconductor chip.

According to the one embodiment, it is possible to facilitate assembly of the semiconductor device.

DETAILED DESCRIPTION

In the embodiments below, the same or similar elements are identified by the same reference signs, and will not be described over and over again, when there is no particular need.

Further, when there is the need for that in the embodiments below, descriptions will be made into a plurality of sections or divided into preferred embodiments. Unless otherwise specified for a special case, they are not unrelated to each other, and one is relevant to modifications, specifications, and supplementary descriptions of a part or the entire of the other.

In the embodiments below, when referring to the number (including the number of items, numerical values, amounts, and ranges) of elements, it is not limited to the particular number, and any other number greater or lower than the particular number is possible, unless otherwise specified or limited obviously in principle.

In the embodiments below, needless to say, the constituent elements (including element steps) are not necessarily essential, unless otherwise specified or obviously necessary in principle.

In the embodiments below, needless to say, for the constituent elements, those terms "formed from A", "formed of A", "have A", and "include A" do not imply that any other elements are excluded, unless otherwise specified for a particular element. Similarly, in the embodiments below, when referring to the forms or positional relationship of the constituent elements, substantially resembling or similar forms are included, unless otherwise specified or obviously impossible in principle. The same applies to the above numerical values and ranges.

The preferred embodiments of the present invention will specifically be described based on the drawings. In the entire illustrations for explaining the embodiments, those members having the same function are identified by the same referential signs, and will not be described over and over again. For the sake of simple illustration, some part may be hatched even in plan view.

Structure of Semiconductor Device

Figure 1:
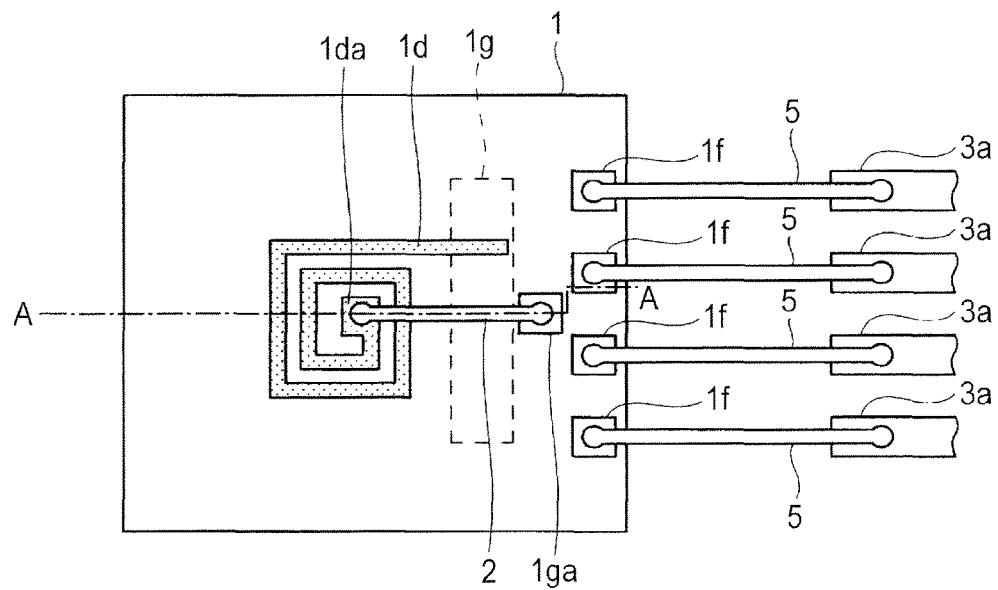
FIG. 1 is a plan view showing an example of a basic structure of the main section of a semiconductor device according to an embodiment.
Figure 2:
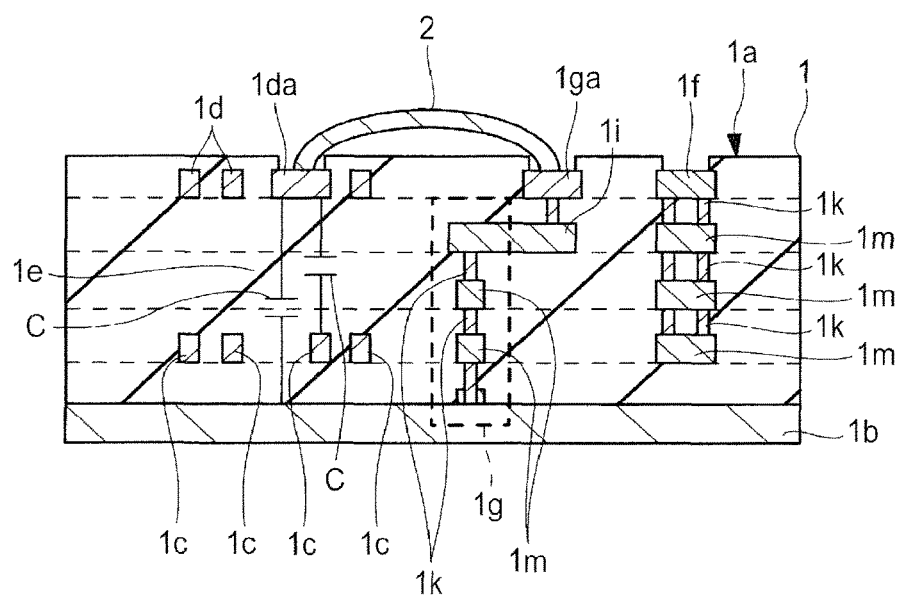
FIG. 2 is a cross sectional view showing a structure taken along a line A-A illustrated in FIG. 1.
Figure 3:
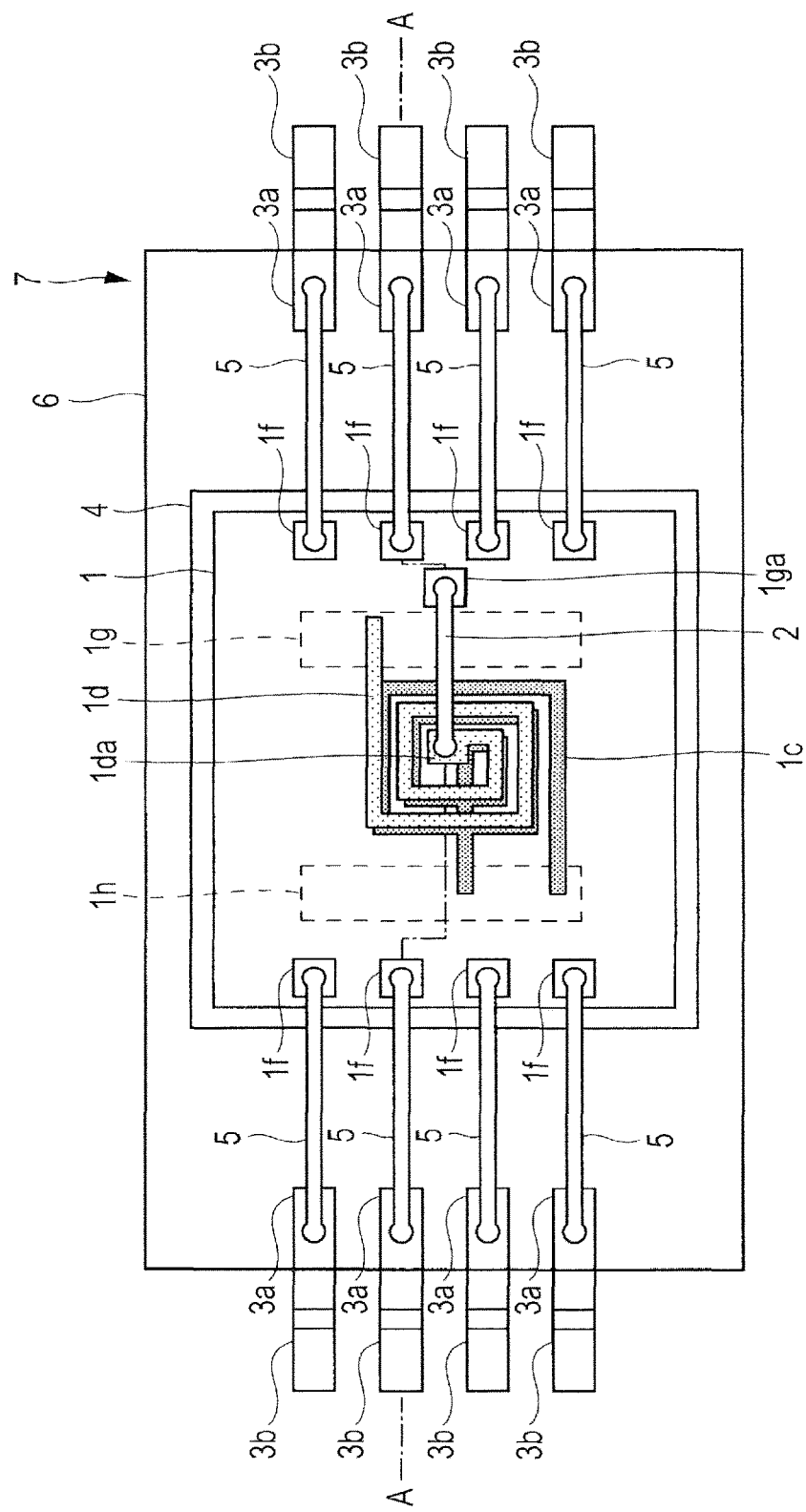
FIG. 3 is a plan view showing an example of the structure of a semiconductor device of the embodiment, viewed through the inside thereof.
Figure 4:
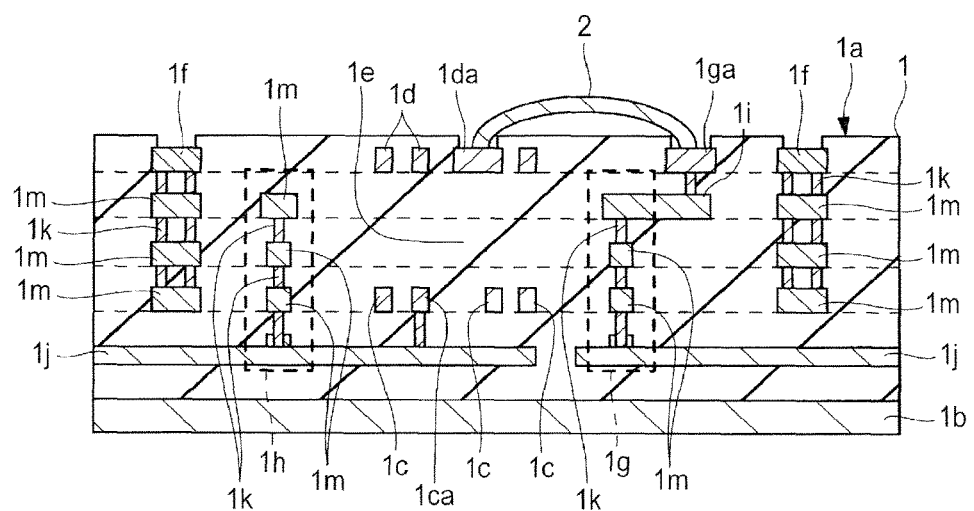
FIG. 4 is a cross sectional view showing an example of a structure of a semiconductor chip mounted over the semiconductor device of FIG. 3.
Figure 5:
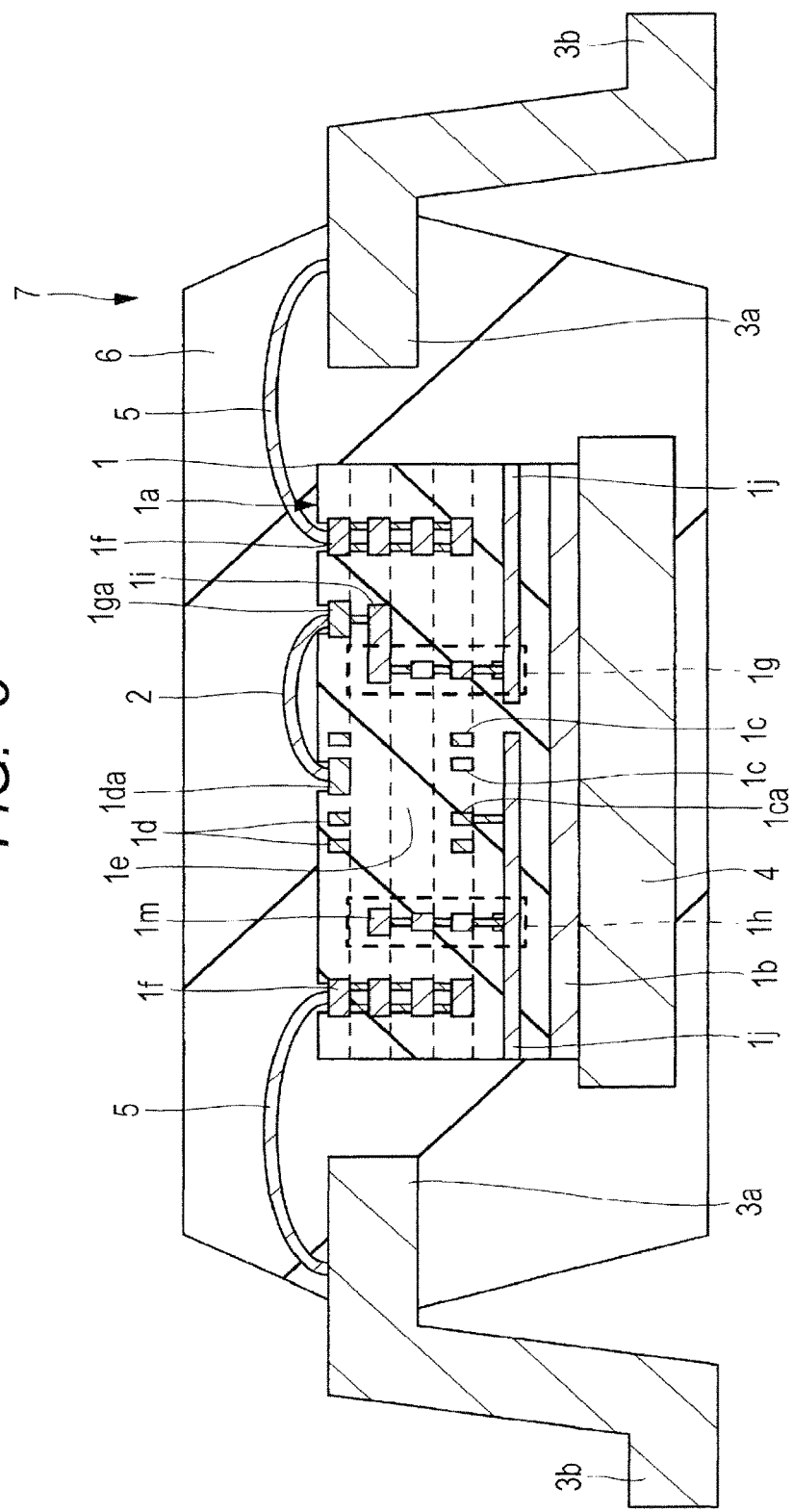
FIG. 5 is a cross sectional view showing a structure taken along a line A-A illustrated in FIG. 3.

FIG. 1 is a plan view showing an example of a basic structure of the main section of a semiconductor device of an embodiment. FIG. 2 is a cross sectional view showing a structure taken along a line A-A illustrated in FIG. 1. FIG. 3 is a plan view showing an example of a structure of a semiconductor device of the embodiment, viewed through the inside thereof. FIG. 4 is a cross sectional view showing an example of a structure of a semiconductor chip mounted over the semiconductor device illustrated in FIG. 3. FIG. 5 is a cross sectional view showing a structure taken along a line A-A illustrated in FIG. 3.

As illustrated in the basic structure of FIG. 1 and FIG. 2, in the semiconductor device of this embodiment, a pair of inductors (coils) are arranged over a semiconductor chip mounted thereinside. In the chip, the two inductors (a pair of inductor elements which are also referred to as micro transformer elements) are inductively coupled, thereby transmitting an electric signal contactlessly between the inductors. In this case, a source voltage greatly varies between the inductors to be inductively coupled. That is, the source voltage is approximately several V at the low voltage side, and approximately several hundred V to several thousand V at the high voltage side. Thus, an electric signal is transmitted contactlessly through an insulating film (insulating layer) between the inductors.

A semiconductor chip 1 has a circuit unit externally transmitting signals and a circuit unit externally receiving signals. That is, in the semiconductor device of this embodiment, the two coils for coupling the inductors and the circuit units for transmitting/receiving signals to the coils are incorporated in one semiconductor chip. This semiconductor device includes one chip semiconductor package.

Descriptions will now be made to uses of the semiconductor device of this embodiment. The semiconductor device of this embodiment may be applied, for example, to vehicles (EV: electric vehicles, HV: hybrid vehicles), switching power supplies, lighting controllers, solar power generation controllers, cell phones, or mobile communication units.

Among the above uses, for the use in the vehicles, a supply source voltage at the low voltage side of the semiconductor chip 1 is approximately 5V, for example, while a supply source voltage at the high voltage side is approximately 600V to 1000V or greater.

Descriptions will now be made to a detailed structure of the semiconductor device of this embodiment with reference to FIG. 3 to FIG. 5. In this embodiment, the descriptions will be made to a SOP (Small Outline Package) 7 by way of example of the semiconductor device.

As illustrated in FIG. 4, incorporated in the SOP 7 are a substrate 1b as a silicon base plate, circuit units provided over the substrate 1b, and the semiconductor chip 1 including a plurality of electrode pads 1f exposed to the main surface 1a. Further, in the semiconductor chip 1, over the substrate 1b, a lower layer coil (lower layer inductor) 1c and an upper layer coil (upper layer inductor) 1d are laminated through an interlayer insulating film 1e formed therebetween. In addition, provided thereon are a first circuit unit (circuit unit) 1g electrically coupled to the upper layer coil 1d and a second circuit unit 1h electrically coupled to the lower layer coil 1c.

That is, the lower layer coil 1c and the upper layer coil 1d are arranged and opposed through the interlayer insulating film 1e. In other words, the lower layer coil 1c and the upper layer coil 1d are electrically insulated (separated). Thus, inside the chip, the lower layer coil 1c and the upper layer coil 1d are inductively coupled. As a result, it is possible to transmit electric signals contactlessly between the lower layer coil 1c and the upper layer coil 1d.

The lower layer coil 1c and the upper layer coil 1d are formed from, for example, copper (Cu) wiring. The interlayer insulating film 1e between the lower layer coil 1c and the upper layer coil 1d is formed from, for example, polyimide.

The lower layer coil 1c and the upper layer coil 1d have a square spiral shape in planar form.

As illustrated in FIG. 5, the semiconductor chip 1 is mounted over a die pad 4 through a die bonding material as an adhesive material.

Further, wire 2 (first wire) is arranged over the main surface 1a of the semiconductor chip 1, as external wiring for electrically coupling the upper layer coil 1d and a first circuit unit 1g. That is, the wire 2 is to electrically couple a terminal 1da of the upper layer coil 1d and a terminal 1ga of the first circuit unit 1g, and is external wiring arranged over the external part of the semiconductor chip 1.

Inside the chip, if it is intended to electrically couple the upper layer coil 1d and the first circuit unit 1g using internal wiring, the terminal 1da of the upper layer coil 1d cannot be led out in the same layer as the upper layer coil 1d, because it is arranged near the center of the coil. Thus, the wire 2 is used as external wiring of the semiconductor chip 1, to electrically couple the upper layer coil 1d and the first circuit unit 1g. The internal wiring may be led out in a different layer from that of the upper layer coil 1d. In this case, the number of layers of the semiconductor chip 1 increases, thus resulting in increasing the cost for that.

Therefore, in the SOP 7 of this embodiment, the upper layer coil 1d and the first circuit unit 1g in the semiconductor chip 1 are electrically coupled using the external wiring (wire 2).

As illustrated in FIG. 3, the SOP 7 has a plurality of inner leads (lead units) 3a arranged around the semiconductor chip 1, outer leads 3b as external terminals coupled respectively to the inner leads 3a, and a plurality of wires (second wires) 5 for electrically coupling the electrode pads 1f of the semiconductor chip 1 and the inner leads 3a.

That is, in the SOP 7, the electrode pads 1f are arranged over the periphery of two opposing sides of the main surface 1a of the semiconductor chip 1, and the inner leads 3a are arranged opposed to the two opposing sides of the main surface 1a of the semiconductor chip 1.

Thus, as illustrated in FIG. 3, the inner leads 3a in the SOP 7 are arranged opposed to the two opposing sides of the main surface 1a of the semiconductor chip 1. Thus, the wires 5 coupled to the inner leads 3a extend along the same direction.

In the SOP 7 of this embodiment, the wire 2 is formed to extend along the extending direction of the wires 5. That is, the wire 2 arranged over the semiconductor chip 1 and the wires 5 for assembly to be coupled to the inner leads 3a are formed in the same direction.

Further, the wire 2 arranged over the semiconductor chip 1 is shorter than each of the wires 5. That is, the wire 2 along the extending direction of the wires 5 is shorter than each of the wires 5.

In the SOP 7, the wire 2 is used as a part of the upper layer coil 1d. In other words, the wire 2 has a coil function. Specifically, as illustrated in FIG. 3, one end of the wire 2 is coupled to the terminal 1da of the upper layer coil 1d, while the other end thereof is coupled to the terminal 1ga of the first circuit unit 1g. When to design the upper layer coil 1d, the designing is done in consideration of the resistance value, while the wire 2 is regarded as a part of the upper layer coil 1d. That is, the designing is done while a region up to the boundary to a part of the terminal 1ga of the wire 2 is regarded as the upper layer coil 1d.

This results in facilitating the designing of the coil.

The coil (inductor) may be designed without regarding the wire 2 as a part of the upper layer coil 1d. That is, the wire 2 may not have the coil function. In this case, the region up to the terminal 1da of the upper layer coil 1d is designed as the coil (inductor).

In the SOP 7, each of the outer leads 3b is formed in a gull wing shape, as illustrated in FIG. 5.

Either one of the first circuit unit 1g and the second circuit unit 1h formed in the semiconductor chip 1 is a transmission circuit, and the other one is a reception circuit. For example, when the first circuit unit 1g electrically coupled to the upper layer coil 1d through the wire 2 is the transmission circuit, the second circuit unit 1h electrically coupled to the lower layer coil 1c is the reception circuit. At this time, the transmission circuit is to externally transmit signals, while the reception circuit is to externally receive signals.

For example, when the first circuit unit 1g electrically coupled to the upper layer coil 1d through the wire 2 is the reception circuit, the second circuit unit 1h electrically coupled to the lower layer coil 1c is the transmission circuit.

As illustrated in FIG. 4, inside the semiconductor chip 1, the first circuit unit 1g and the second circuit unit 1h are formed over two mutually insulated SOI (Silicon On Insulator) 1j. Each of the first circuit unit 1g and the second circuit unit 1h is formed with internal wiring 1m and via wiring 1k. The second circuit unit 1h is electrically coupled to a terminal 1ca of the lower layer coil 1c. The first circuit unit 1g is led out by leading out wiring 1i, and this leading out wiring 1i is coupled to the terminal 1ga of the first circuit unit 1g.

By arranging the leading out wiring 1i in this manner, the minimum distance of the wire 2 is secured. That is, for wire-bonding of the wire 2, it is necessary to arrange the pads at a space of approximately 1 mm (distance between pads). Thus, to secure this distance, the first circuit unit 1g is coupled to the terminal 1ga through the leading out wiring 1i.

In the SOP 7 of this embodiment, the first circuit unit 1g is formed in a space right under the wire 2 of the semiconductor chip 1, using the length of 1 mm of the wire 2.

That is, as illustrated in FIG. 3, in plan view, the first circuit unit 1g is arranged between the terminal 1da of the upper layer coil 1d which is coupled to the one end of the wire 2 and the terminal 1ga of the first circuit unit 1g which is coupled to the other end of the wire 2.

That is, the first circuit unit 1g is arranged in a position overlapping the wire 2, in plan view.

The first circuit unit 1g and the second circuit unit 1h may be any circuit other than the transmission/reception circuits, for example, a logic circuit.

In the SOP 7, as illustrated in FIG. 5, a resin made sealing member 6 is formed to cover the semiconductor chip 1, the inner leads 3a, the wire 2, and the wires 5. The sealing member 6 is formed of, for example, a resin molding, with, for example, a thermosetting epoxy resin.

In the SOP 7, it is preferred that the wire 2 and the wires 5 be formed of the same material, for example, gold (Au) wire or copper (Cu) wire.

In the SOP (semiconductor device) 7 of this embodiment, the lower layer coil 1c, the upper layer coil 1d, and the first circuit unit 1g coupled to the upper layer coil 1d are provided over one chip. Further, the external wiring wire 2 for coupling the upper layer coil 1d and the first circuit unit 1g extends along the same direction as the assembling wires 5. As a result, it is possible to restrain the occurrence of the wire flow of the wire 2 at the time of resin molding. That is, at the resin molding, the molding is performed in a state where the resin is set to flow in the extending direction of the wires 5. Thus, it is possible to restrain the wire flow of the wire, by forming the wire 2 in the same direction as that of the wires 5.

This enables to restrain fall of the wire 2 and distortion of the wire 2 at the time of resin molding for forming the sealing member 6. As a result, it is possible to facilitate assembly of the semiconductor device.

Because the lower layer coil 1c, the upper layer coil 1d, and the first circuit unit 1g coupled to the upper layer coil 1d are formed over one chip, it is possible to prevent the occurrence of a difference in chip thicknesses of two chips, a difference in film structures of the interlayer insulating films, and a difference in the pad structures. As a result, as compared to the assembly using the two chips, it is possible to restrain the increase in the assembly difficulty of the semiconductor device. This difficulty results from the occurrence of the difference in the chip thicknesses, the difference in the film structures of the interlayer insulating films, and the difference in the pad structures.

Therefore, it is possible to further facilitate assembly of the semiconductor device.

Because the wire 2 arranged over the semiconductor chip 1 is shorter than each of the wires 5, it is possible to restrain the occurrence of the wire flow of the wire 2 in the resin mold for forming the sealing member 6. Further, because the wire 2 is short, the electric resistance of the wire 2 can be lowered (decreased), and the electrical characteristic of the wire 2 can be improved. Because the wire 2 is short, the electrical characteristic of the wire 2 is lowered, when the wire 2 is regarded as a part of the upper layer coil 1d. Thus, the capacity C of the upper layer coil 1d can be reduced, or the noise can be reduced, thereby enhancing the coil characteristic.

The first circuit unit 1g is, in plan view, arranged between the pads of the wire 2, that is, in a position between the terminal 1da of the upper layer coil 1d and the terminal 1ga of the first circuit unit 1g. Alternatively, the first circuit unit 1g is, in plan view, arranged in a position overlapping the wire 2. This enables the efficient layout of the circuit unit. Because the layout of the circuit unit in the chip can be made with high efficiency, the semiconductor chip 1 can be miniaturized. As a result, the SOP (semiconductor device) 7 can be miniaturized.

The wire 2 and the wires 5 are formed of the same material. Thus, in a wire bonding process, the wire 2 and the wires 5 can be both bonded in the same bonding process without changing the wires. This enables to improve the assembly efficiency of the semiconductor device. In the wire bonding process, of the wire 2 and the wires 5, the wire 2 arranged over the inner side is bonded ahead of the other. After the wire 2 is bonded, the wires 5 arranged in the positions over the outer side of the wire 2 are bonded.

Figure 6:
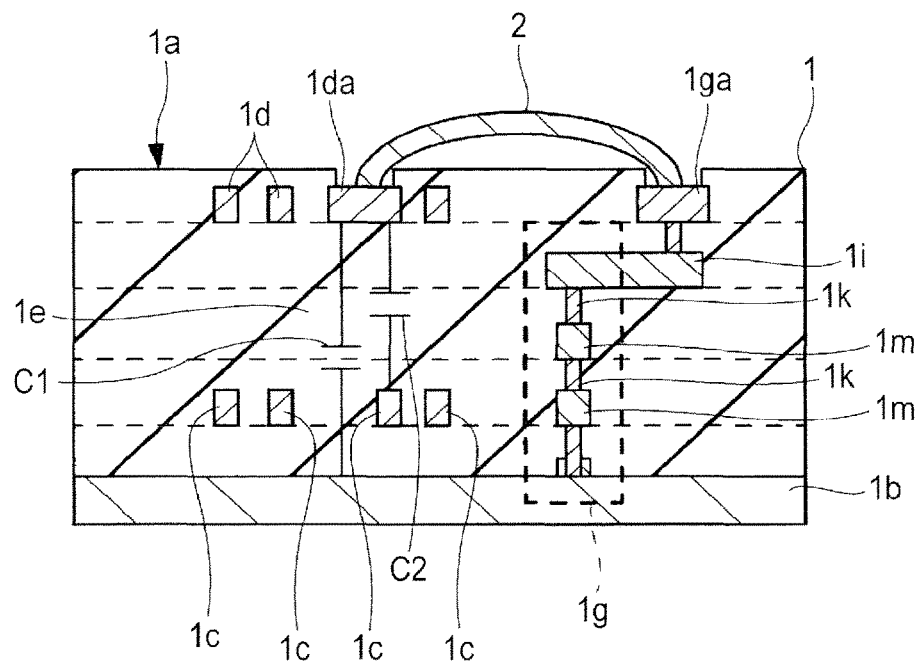
FIG. 6 is a cross sectional view showing a basic structure of a semiconductor chip mounted over the semiconductor device of the embodiment.
Figure 7:
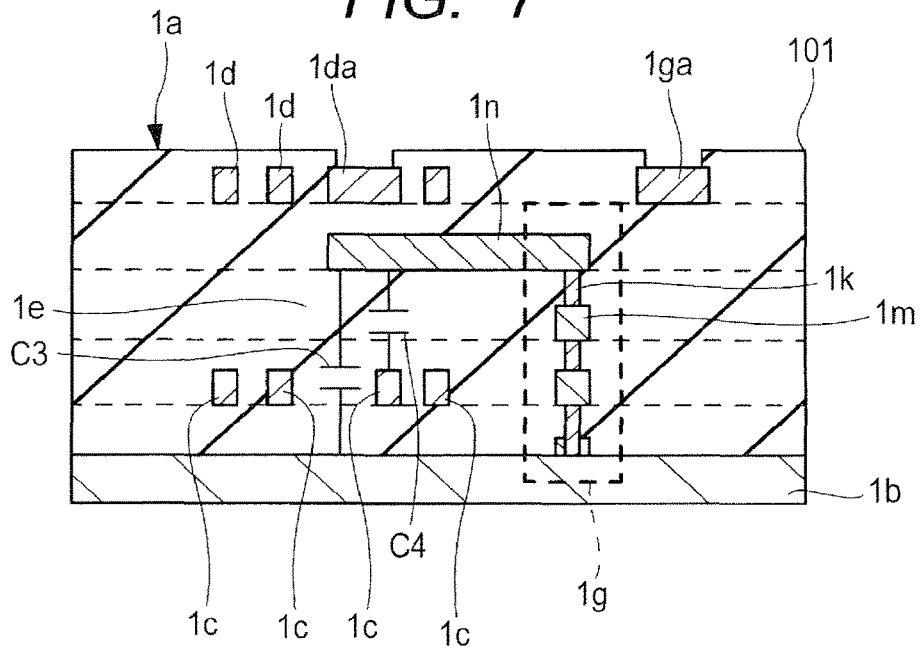
FIG. 7 is a cross sectional view showing a structure of a semiconductor chip of a comparative example.
Figure 8:
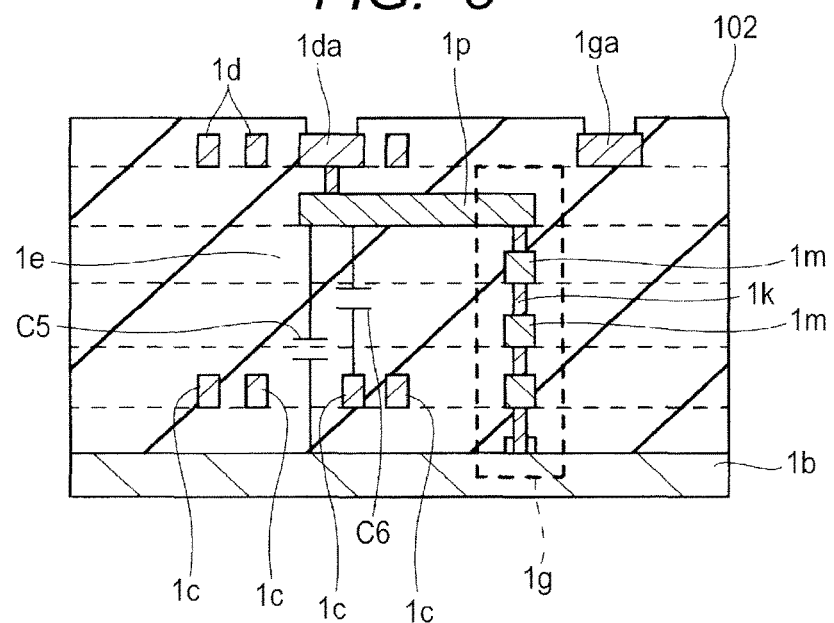
FIG. 8 is a cross sectional view showing a structure of a semiconductor chip of another comparative example.

A comparison is made between the semiconductor device of this embodiment and a structure to be compared/investigated by the present inventors. FIG. 6 is a cross sectional view showing a basic structure of a semiconductor chip mounted over the semiconductor device of the embodiment. FIG. 7 is a cross sectional view showing a structure of a semiconductor chip of a comparative example. FIG. 8 is a cross sectional view showing a structure of a semiconductor chip of another comparative example.

In the semiconductor chip 1 of the semiconductor device (SOP 7) of this embodiment, as illustrated in FIG. 6, the upper layer coil 1d and the first circuit unit 1g are coupled through the external wiring (wire 2), and the first circuit unit 1g is arranged between the pads (the terminal 1da of the upper layer coil 1d and the terminal 1ga of the first circuit unit 1g) coupled to the wire 2.

Whereas, in the structure of the comparative example of FIG. 7, the upper layer coil 1d and the first circuit unit are electrically coupled to each other through an internal layer leading out wiring 1n, instead of using the external wiring (wire 2) illustrated in FIG. 6.

In the case of the structure illustrated in FIG. 7, in a semiconductor chip 101, the distance between the leading out wiring 1n and the substrate 1b is shorter than the distance between the upper layer coil 1d and the substrate 1b of FIG. 6. As a result, capacity C3 between the leading out wiring 1n and the substrate 1b of FIG. 7 is greater than capacity C1 between the upper layer coil 1d and the substrate 1b of FIG. 6. Further, capacity C4 between the leading out wiring 1n and the lower layer coil 1c of FIG. 7 is greater than capacity C2 between the upper layer coil 1d and the lower layer coil 1c of FIG. 6.

That is, in the structure of the comparative example illustrated in FIG. 7, the capacity cannot be reduced.

In the case illustrated in FIG. 7, the distance between the leading out wiring 1n and the substrate 1b is shorter than the distance between the upper layer coil 1d and the substrate 1b of FIG. 6. Thus, it is not possible to improve the tolerance as compared with the structure of this embodiment illustrated in FIG. 6. As a result, in the structure of the comparative example of FIG. 7, both the capacity reduction and the tolerance improvement cannot be attained, as compared with the structure of this embodiment illustrated in FIG. 6.

In the structure of another comparative example of FIG. 8, one wiring layer is added, and leading out wiring 1p is formed over this wiring layer, instead of using the external wiring (wire 2) illustrated in FIG. 6. Then, the upper layer coil 1d and the first circuit unit 1g are coupled to each other using this leading out wiring 1p.

In the case of the structure illustrated in FIG. 8, in a semiconductor chip 102, the distance between the leading out wiring 1p and the substrate 1b is equal to the distance between the upper layer coil 1d and the substrate 1b of FIG. 6. Thus, the capacity C1 between the upper layer coil 1d and the substrate 1b of FIG. 6 is equal to capacity C5 between the leading out wiring 1p and the substrate 1b of FIG. 8. Further, the capacity C2 between the upper layer coil 1d and the lower layer coil 1c of FIG. 6 is equal to capacity C6 between the leading out wiring 1p and the lower layer coil 1c of FIG. 8.

As a result, the structure of another comparative example illustrated in FIG. 8 has the same properties as those of the structure of this embodiment of FIG. 6, in their capacity and the tolerance. However, in the structure of another comparative example of FIG. 8, one wiring layer is added to form the leading out wiring 1p, as compared with the structure of FIG. 6, thus increasing the cost for the semiconductor chip 1.

According to the chip structure using the external wiring (wire 2) in this embodiment illustrated in FIG. 6, it is possible to attain the capacity reduction and the tolerance improvement both between the upper layer coil 1d and the lower layer coil 1c and between the upper layer coil 1d and the substrate 1b, without increasing the number of wiring layers and increasing the cost.

Because the wire 2 as the external wiring over the chip extends along the same direction as each of the assembling wires 5, it is possible to restrain fall of the wire and distortion of the wire due to the wire flow of the wire 2 at the time of resin molding. This enables to facilitate assembly of the semiconductor device.

Because the first circuit unit 1g as transmission/reception circuit units is arranged between both pads for coupling the wire 2, the free space in the chip can effectively be used, and the layout of the circuit unit in the chip can be made with high efficiency. This enables that the semiconductor chip 1 is miniaturized.

First Modification

Figure 9:
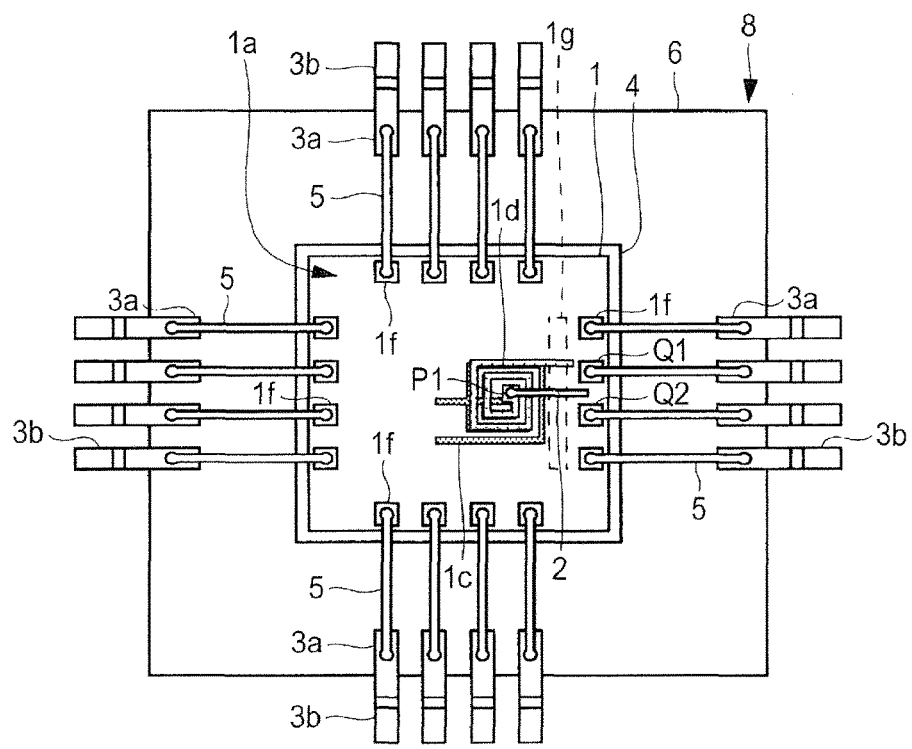
FIG. 9 is a plan view showing a structure of a semiconductor device of a first modification, viewed through the inside thereof.

FIG. 9 is a plan view showing a structure of a semiconductor device according to a first modification, viewed through the inside thereof.

The semiconductor device illustrated in FIG. 9 is a QFP (Quad Flat Package) 8 having a plurality of lead units arranged around the sour sides of the main surface 1a of the semiconductor chip 1. In this first modification, descriptions will be made to the QFP 8.

In the above embodiment, the descriptions have been made to the SOP 7 including the two coils for one chip and the transmission/reception circuits electrically coupled to these coils, incorporated therein. In the first modification, descriptions will now be made the QFP 8 as an example of a considered case in which the number of pins is increased for the sake of improving the chip function.

In the structure of the QFP 8 illustrated in FIG. 9, the semiconductor chip 1 is incorporated. This semiconductor chip 1 includes the substrate 1b illustrated in FIG. 4, a pair of laminated lower layer coil 1c and upper layer coil 1d through an interlayer insulating film 1e formed therebetween over the substrate 1b, a first circuit unit 1g as a circuit unit coupled to the upper layer coil 1d, and a plurality of electrode pads 1f. The semiconductor chip 1 has a second circuit unit 1h electrically coupled to the lower layer coil 1c. The first circuit unit 1g and the second circuit unit 1h are, for example, a transmission circuit or a reception circuit. However, they may be any other circuit other than the transmission/reception circuits, for example, a logic circuit.

Over the semiconductor chip 2, wire (first wire) 2 is provided as external wiring for electrically coupling the upper layer coil 1d and the first circuit unit 1g.

Further included are inner leads 3a as a plurality of lead units arranged around the four sides of the main surface 1a of the semiconductor chip and outer leads 3b as a plurality of external terminals coupled respectively to the inner leads 3a. Provided are a plurality of electrode pads 1f of the semiconductor chip 1 and a plurality of wires (second wires) 5 electrically coupled to the inner leads 3a.

A resin made sealing member 6 is formed to cover the semiconductor chip 1, the inner leads 3a, the wire 2, and the wires 5.

The wire 2 in the QFP 8 extends along the extending direction of the wire 5 coupled to the electrode pad 1f formed in the position nearest to the center P1 of the upper layer coil 1d in plan view, of the electrode pads 1f provided along four sides of the main surface 1a of the semiconductor chip 1. In other words, the wire 2 as the external wiring extends along the same direction as that of the wire 5 coupled to the electrode pad 1f formed in the position nearest to the center P1 of the upper layer coil 1d, of the electrode pads 1f provided along the four sides of the main surface 1a of the semiconductor chip 1.

In the structure illustrated in FIG. 9, the wire 2 extends along the same direction as that of the wire 5 coupled to the electrode pad 1f (Q1 or Q2) formed in the position nearest to the center P1 of the upper layer coil 1d. When there are a plurality of electrode pads 1f nearest to the center P1 of the upper layer coil 1d, approximately at the same distance, any of these electrode pads 1f may be selected. In this case, it may extend along the same direction as the extending direction of the wire 5 coupled to the selected electrode pad 1f.

Like the SOP 7 of the above embodiment, the wire 2 is shorter than each of the wires 5.

Further, like the semiconductor chip 1 illustrated in FIG. 4, the first circuit unit 1g is arranged, in plan view, between a terminal 1da of the upper layer coil 1d to which one end of the wire 2 is coupled and a terminal 1ga of the first circuit unit 1g to which the other end of the wire 2 is coupled. In other words, the first circuit unit 1g is arranged in a position overlapping the wire 2, in plan view.

Any other structures of the QFP 8 of the first modification are the same as the SOP 7 of the above embodiment, and thus will not be described over and over again.

According to the QFP 8 of the first modification, the wire 2 extends along the same direction as the assembling wire 5 in the nearest position. As a result, like the SOP 7 of the above embodiment, it is possible to restrain fall of the wire or distortion of the wire due to the wire flow of the wire 2 at the time of resin molding, and it is also possible to facilitate assembly of the semiconductor device.

Because the wire 2 arranged over the semiconductor chip 1 is shorter than each of the wires 5, it is possible to restrain occurrence of the wire flow of the wire 2 in the resin molding for forming the sealing member 6. Further, because the wire 2 is formed short, the electric resistance of the wire 2 can be lowered (decreased), thus improving the electrical characteristic of the wire 2.

The first circuit unit 1g as the transmission/reception circuit unit is arranged between both pads for coupling the wire 2. This enables effective use of the free space in the chip, and enables the efficient layout of the circuit unit in the chip. As a result, it is possible to attain miniaturization of the semiconductor chip 1.

Any other effects to be attained by the QFP 8 of the first modification are the same as those of the SOP 7 of the above embodiment, and thus will not be described over and over again.

Second Modification

Figure 10:
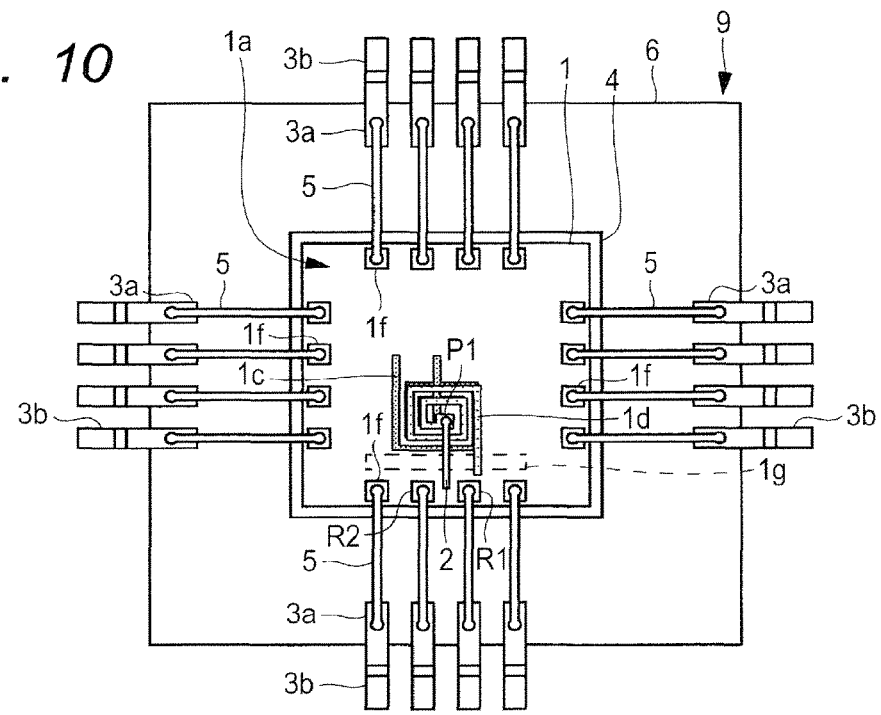
FIG. 10 is a plan view showing a structure of a semiconductor device of a second modification, viewed through the inside thereof.

FIG. 10 is a plan view showing a structure of a semiconductor device of a second modification, viewed through the inside thereof.

The second modification is to describe a QFP 9 having the same structure as that of the first modification. Though the QFP 9 has the same structure as the QFP 8 of the first modification, differences between them are the positions of the upper layer coil 1d and the lower layer coil 1c over the semiconductor chip 1 and also the directions of the coils.

In the case of the QFP 9, the wire 2 extends along the extending direction of the wire 5 coupled to the electrode pad 1f formed in the position nearest to the center P1 of the upper layer coil 1d in plan view, of the electrode pads 1f formed along four sides of the main surface 1a of the semiconductor chip 1. In other words, the wire 2 as the external wiring extends along the same direction as that of the wire 5 coupled to the electrode pad 1f formed in the position nearest to the center P1 of the upper layer coil 1d, of the electrode pads 1f provided along the four sides of the main surface 1a of the semiconductor chip 1.

In the structure illustrated in FIG. 10, the wire 2 extends along the same direction as the extending direction of the wire 5 coupled to the electrode pad 1f (R1 or R2) formed in the position nearest to the center P1 of the upper layer coil 1d.

Like the QFP 8 of the first modification, the wire 2 is shorter than each of the wires 5.

Further, like the semiconductor chip 1 illustrated in FIG. 4, the first circuit unit 1g is arranged, in plan view, between the terminal 1da of the upper layer coil 1d to which one end of the wire 2 is coupled and the terminal 1ga of the first circuit unit 1g to which the other end of the wire 2 is coupled.

Any other structures of the QFP 9 of this second modification are the same as those of the QFP 8 of the first modification, and thus will not be described over and over again.

According to the QFP 9 of the second modification, the wire 2 extends along the same direction as that of the assembly wire 5 formed in the nearest position. Thus, like the QFP 8 of the first modification, it is possible to restrain fall of the wire or distortion of the wire due to the wire flow of the wire 2 at the time of resin molding, and it is also possible to facilitate assembly of the semiconductor device.

Because the wire 2 arranged over the semiconductor chip 1 is shorter than each of the wires 5, it is possible to further restrain occurrence of the wire flow of the wire 2 at the time of resin molding for forming the sealing member 6. Because the wire 2 is formed short, the electric resistance of the wire 2 can be lowered (decreased), thus improving the electrical characteristic.

The first circuit unit 1g as transmission/reception circuits is arranged between both pads for coupling the wire 2. This enables effective use of the free space in the chip, and enables to increase the efficient layout of the circuit unit in the chip. As a result, it is possible to attain miniaturization of the semiconductor chip 1.

Any other effects to be attained by the QFP 9 of the second modification are the same as those of the QFP 8 of the first modification, and thus will not be described over and over again.

Third Modification

Figure 11:
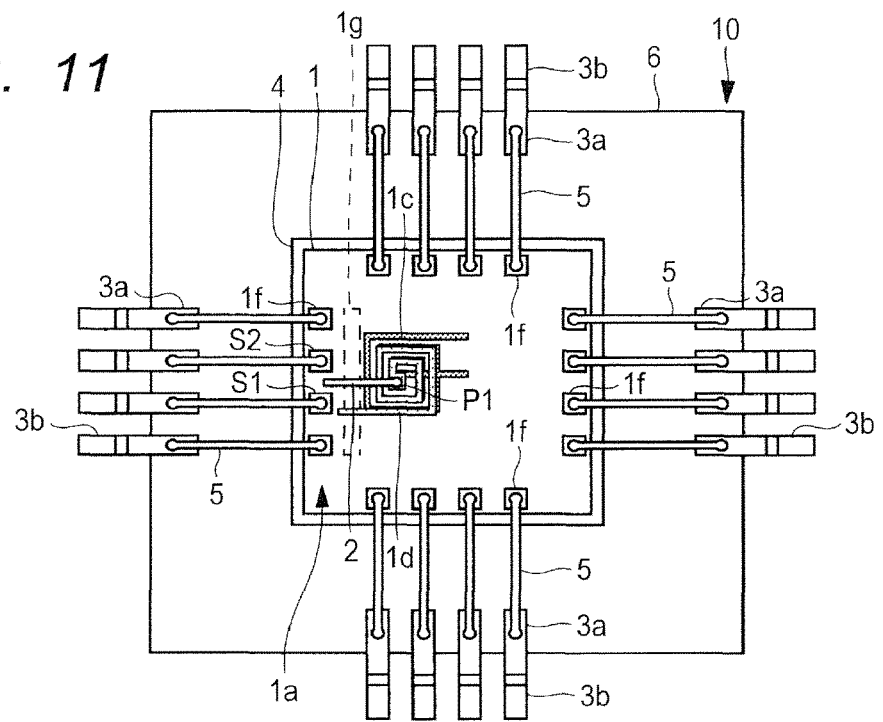
FIG. 11 is a plan view showing a structure of a semiconductor device of a third modification, viewed through the inside thereof.

FIG. 11 is a plan view showing a structure of a semiconductor device of a third modification, viewed through the inside thereof.

The third modification is to describe a QFP 10 having the same structure as that of the first modification. The QFP 10 has the same structure as that of the QFP 8 of the first modification, and differences between them are the positions of the upper layer coil 1d and the lower layer coil 1c over the semiconductor chip 1 and also the directions of the coils.

In the case of the QFP 10, the wire 2 extends along the extending direction of the wire 5 coupled to the electrode pad 1f formed in the position nearest to the center P1 of the upper layer coil 1d in plan view, of the electrode pads 1f provided along four sides of the main surface 1a of the semiconductor chip 1. In other words, the wire 2 as the external wiring extends along the same direction as that of the wire 5 coupled to the electrode pad 1f formed in the position nearest to the center P1 of the upper layer coil 1d, of the electrode pads 1f provided along the four sides of the main surface 1a of the semiconductor chip.

In the structure illustrated in FIG. 11, the wire 2 extends along the same direction as the extending direction of the wire 5 coupled to the electrode pad 1f (S1 or S2) formed in the position nearest to the center P1 of the upper layer coil 1d.

Like the QFP 8 of the first modification, the wire 2 is shorter than each of the wires 5.

Further, like the semiconductor chip 1 illustrated in FIG. 4, the first circuit unit 1g is arranged, in plan view, between the terminal 1da of the upper layer coil 1d to which one end of the wire 2 is coupled and the terminal 1ga of the first circuit unit 1g to which the other end of the wire 2 is coupled.

Any other structures of the QFP 10 of the third modification are the same as those of the QFP 8 of the first modification, and thus will not be described over and over again.

According to the QFP 10 of the third modification, the wire 2 extends along the same direction as the assembling wire 5 in the nearest position. As a result, like the QFP 8 of the first modification, it is possible to restrain fall of the wire or distortion of the wire due to the wire flow of the wire 2 at the time of resin molding, and it is also possible to facilitate assembly of the semiconductor device.

Because the wire 2 arranged over the semiconductor chip 1 is shorter than each of the wires 5, it is possible to further restrain occurrence of the wire flow of the wire 2 at the time of resin molding for forming the sealing member 6. In addition, because the wire 2 is formed short, the electric resistance of the wire 2 can be lowered (decreased), thus improving the electrical characteristic of the wire 2.

The first circuit unit 1g is arranged as the transmission/reception circuits between both pads for coupling the wire 2. This enables effective use of the free space in the chip, and enables the efficient layout of the circuit unit in the chip. As a result, it is possible to attain miniaturization of the semiconductor chip 1.

Any other effects to be attained by the QFP 10 of the third modification are the same as those of the QFP 8 of the first modification, and thus will not be described over and over again.

Forth Modification

Figure 12:
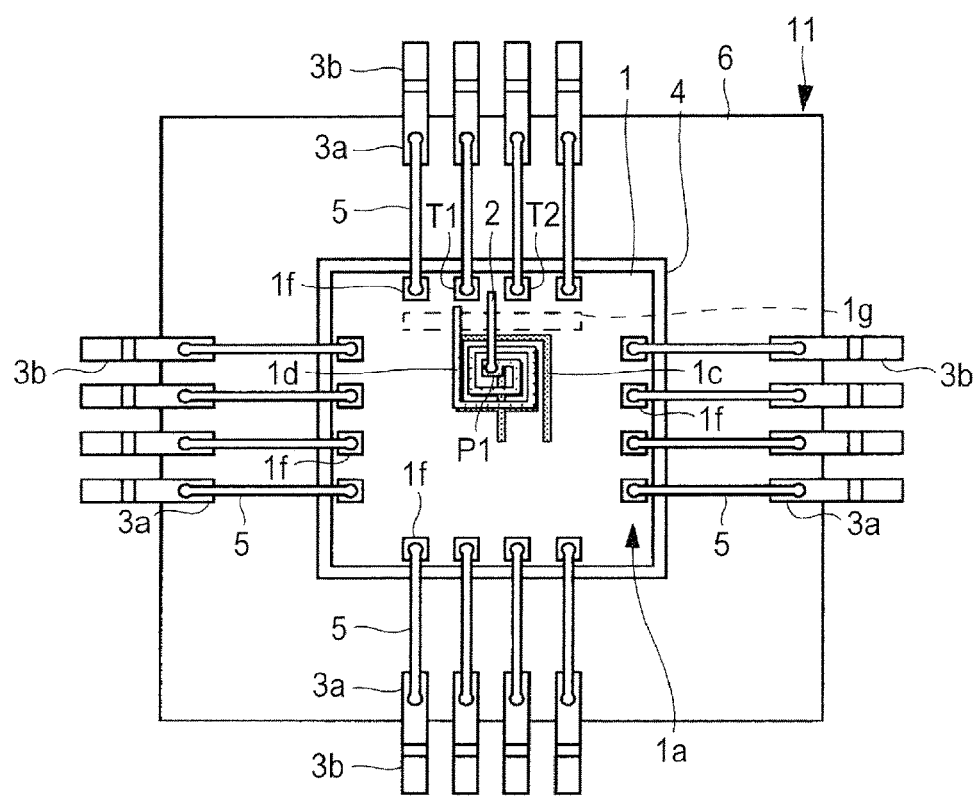
FIG. 12 is a plan view showing a structure of a semiconductor device of a fourth modification, viewed through the inside thereof.

FIG. 12 is a plan view illustrating a structure of a semiconductor device of a forth modification, viewed through the inside thereof.

The forth modification is to describe a QFP 11 having the same structure as that of the first modification. A QFP 11 has the same structure as that of the QFP 8 of the first modification, and differences between them are the positions of the upper layer coil 1d and the lower layer coil 1c over the semiconductor chip 1 and also the directions of the coils.

In the case of the QFP 11 also, the wire 2 extends along the extending direction of the wire 5 coupled to the electrode pad 1f formed in the position nearest to the center P1 of the upper layer coil 1d in plan view, of the electrode pads 1f arranged along four sides of the main surface 1a of the semiconductor chip 1. In other words, the wire 2 as external wiring extends along the same direction as the wire 5 coupled to the electrode pad 1f formed in the position nearest to the center P1 of the upper layer coil 1d, of the electrode pads 1f formed along the four sides of the main surface 1a of the semiconductor chip 1.

In the structure illustrated in FIG. 12, the wire 2 extends along the same direction as the extending direction of the wire 5 coupled to the electrode pad 1f (T1 or T2) formed in the position nearest to the center P1 of the upper layer coil 1d.

Like the QFP 8 of the first modification, the wire 2 is shorter than each of the wires 5.

Further, like the semiconductor chip 1 illustrated in FIG. 4, the first circuit unit 1g is arranged, in plan view, between a terminal 1da of the upper layer coil 1d to which one end of the wire 2 is coupled and a terminal 1ga of the first circuit unit 1g to which the other end of the wire 2 is coupled.

Any other structures of the QFP 11 of the fourth modification are the same as those of the QFP 8 of the first modification, and thus will not be described over and over again.

According to the QFP 11 of the fourth modification, the wire 2 extends along the same direction as the assembling wire 5 formed in the nearest position. As a result, like the QFP 8 of the first modification, it is possible to restrain fall of the wire or distortion of the wire due to the wire flow of the wire 2 at the time of resin molding, and it is also possible to facilitate assembly of the semiconductor device.

Because the wire 2 arranged over the semiconductor chip 1 is shorter than each of the wires 5, it is possible to restrain occurrence of the wire flow of the wire 2 at the time of resin molding for forming the sealing member 6. Because the wire 2 is formed short, the electric resistance of the wire 2 can be lowered (decreased), thus improving the electrical characteristic of the wire 2.

The first circuit unit 1g as the transmission/reception circuit units is arranged between both pads for coupling the wire 2. This enables the effective use of the free space in the chip, and enables the efficient layout of the circuit unit in the chip. As a result, it is possible to attain miniaturization of the semiconductor chip 1.

Any other effects to be attained by the QFP 11 of the fourth modification are the same as those of the QFP 8 of the above first modification, and thus will not be described over and over again.

Accordingly, the descriptions have been made to the inventions presented by the present inventors based on the preferred embodiments. Needless to say, however, the present invention is not limited to the above-described embodiments, and various changes may possibly be made without departing from the scope thereof.

In the above-described embodiments and modifications, the lower layer coil $1c$ and the upper layer coil $1d$ have a square spiral shape in planar form. However, the lower layer coil $1c$ and the upper layer coil $1d$ may have any polygon spiral shape other than the square shape.

In the above embodiments and modifications, the descriptions have been made to the case in which the semiconductor device is the SOP or QFP. However, the above-described semiconductor device may be any other semiconductor device, as long as it has a first wire (wire 2) over the chip and a plurality of second wires (wire 5) coupled to each of the lead units. For example, it may be any other semiconductor device, such as SON (Small Outline Nonleaded package) or QFN (Quad Flat Non-leaded package). Further, it may be any other semiconductor device of a substrate type device, such as BGA (Ball Grid Array).

Further, the combination of the modifications is applicable, without departing from the scope of the technical ideas described in the above embodiments.

What is claimed is:

1. A semiconductor device comprising:
   a substrate;
   a first circuit unit formed over the substrate;
   a second circuit unit formed over the substrate;
   a lower layer coil formed over the substrate;
   an interlayer insulating film formed over the lower layer coil;
   an upper layer coil facing the lower layer coil through the interlayer insulating film;
   a first electrode pad formed over the substrate, the first electrode pad being electrically coupled with the first circuit unit;
   a second electrode pad formed over the substrate, the second electrode pad being electrically coupled with the second circuit unit;
   a first lead disposed around the substrate;
   a first wire electrically coupling the upper layer coil with the first electrode pad; and
   a second wire electrically coupling the first lead with the second electrode pad,
   wherein the first wire extends along an extending direction of the second wire in plan view.

2. The semiconductor device according to claim 1, wherein the first wire is shorter than the second wire.

3. The semiconductor device according to claim 1, wherein the first circuit is arranged, in plan view, between the upper layer coil and the first electrode pad.

4. The semiconductor device according to claim 1, wherein the first wire is overlapped with the first circuit in plan view.

5. The semiconductor device according to claim 1, further comprising a sealing member made of resin, the sealing member sealing the first wire and the second wire.

6. The semiconductor device according to claim 1, wherein the first wire has a coil function.

7. The semiconductor device according to claim 1, wherein the first wire and the second wire are made of a same material.

8. The semiconductor device according to claim 1, wherein the substrate includes a first substrate and a second substrate spaced away from the first substrate, wherein the first circuit and the first electrode pad are formed over the first substrate, and wherein the second circuit, the second electrode pad, the lower layer coil and the upper layer coil are formed over the second substrate.

9. The semiconductor device according to claim 1, wherein the substrate is an SOI substrate.

10. The semiconductor device according to claim 8, wherein the first substrate and the second substrate are SOI substrates, respectively.

11. The semiconductor device according to claim 1, further comprising:
    a plurality of internal wirings and a plurality of via wirings connecting the plurality of internal wirings to each other,
    wherein the first electrode pad is electrically coupled with the first electrical circuit through the plurality of internal wirings and the plurality of via wirings.

12. The semiconductor device according to claim 1, wherein the upper layer coil is formed in the same layer as the first electrode pad.

13. The semiconductor device according to claim 1, wherein the semiconductor device includes a plurality of the second wires and a plurality of the first leads, wherein the plurality of the second wires are respectively electrically coupled with the plurality of the first leads, and wherein the plurality of the second wires are arranged along a side of the substrate.

14. The semiconductor device according to claim 1, further comprising:
    a third electrode pad formed over the substrate;
    a second lead disposed around the substrate; and
    a third wire electrically coupling the second lead with the third electrode pad,
    wherein the third wire extends along a perpendicular to the extending direction of the second wire in plan view.

15. The semiconductor device according to claim 1, wherein the first circuit unit and the second circuit unit include a transistor, respectively.

16. The semiconductor device according to claim 1, wherein the first circuit unit and the second circuit unit do not include a coil.

* * * * *